United States Patent [19]

Saito

[11] Patent Number: 5,797,118
[45] Date of Patent: Aug. 18, 1998

[54] LEARNING VECTOR QUANTIZATION AND A TEMPORARY MEMORY SUCH THAT THE CODEBOOK CONTENTS ARE RENEWED WHEN A FIRST SPEAKER RETURNS

[75] Inventor: Akitoshi Saito, Shizuoka-ken, Japan

[73] Assignee: Yamaha Corporation, Hamamatsu, Japan

[21] Appl. No.: 512,311

[22] Filed: Aug. 8, 1995

[30] Foreign Application Priority Data

Aug. 9, 1994 [JP] Japan .................. 6-208010
Nov. 18, 1994 [JP] Japan .................. 6-309855

[51] Int. Cl.$^6$ .................. G10L 5/00; G10L 1/06
[52] U.S. Cl. .................. 704/222; 704/208; 704/214; 704/223; 704/227; 704/258; 704/264
[58] Field of Search .................. 395/2.1, 2.15, 395/2.17, 2.23, 2.31, 2.32, 2.36, 2.67, 2.73

[56] References Cited

U.S. PATENT DOCUMENTS

| | | | |
|---|---|---|---|
| 5,007,092 | 4/1991 | Galand et al. | 395/2.31 |
| 5,077,798 | 12/1991 | Ichikawa et al. | 395/2.31 |
| 5,194,950 | 3/1993 | Murakami et al. | 348/417 |
| 5,230,036 | 7/1993 | Akamine et al. | 395/2.09 |
| 5,245,662 | 9/1993 | Tnaaguchi et al. | 395/2.28 |
| 5,263,119 | 11/1993 | Tanaka et al. | 395/2.32 |
| 5,271,089 | 12/1993 | Ozawa | 395/2.31 |
| 5,305,332 | 4/1994 | Ozawa | 371/31 |
| 5,371,853 | 12/1994 | Kao et al. | 395/2.32 |
| 5,384,891 | 1/1995 | Asakawa et al. | 395/2.29 |
| 5,524,170 | 6/1996 | Matsuo et al. | 395/2.31 |

*Primary Examiner*—Allen R. MacDonald
*Assistant Examiner*—Alphonso A. Collins
*Attorney, Agent, or Firm*—Loeb & Loeb LLP

[57] ABSTRACT

An encoding/decoding system employing vector quantization realizes a high quality encoding and decoding with decreased quantizing errors, employing a small sized codebook which faithfully represents each of the inputted waveform vectors. An encoding/decoding system includes an encoding apparatus and a decoding apparatus, each having a codebook for storing information vectors representative of a predetermined number of signal patterns and index that determine the information vectors. The encoding apparatus compares a vector representing an object signal to be quantized with each information vector in the codebook, selects an information vector that is closest to the vector and outputs an index for the information vector. The decoding apparatus obtains an information vector corresponding to the index obtained at the encoding apparatus side by referring to the codebook and decodes the object signal. The codebook utilizes a temporary memory connected thereto. The content of the codebook is temporarily moved to the temporary memory when the identity of the speaker changes. The contents of the temporary memory are read out when the original speakers returns to the system.

26 Claims, 9 Drawing Sheets

| | IDX | CODE VECTOR | WRITE PROHIBITION FLAG |
|---|---|---|---|
| $V_0$ | 0 | -------- | 0 |
| $V_1$ | 1 | -------- | 1 |
| ⋮ | ⋮ | ⋮ | |
| $V_{511}$ | 511 | -------- | 0 |
CODEBOOK
FIG. 3
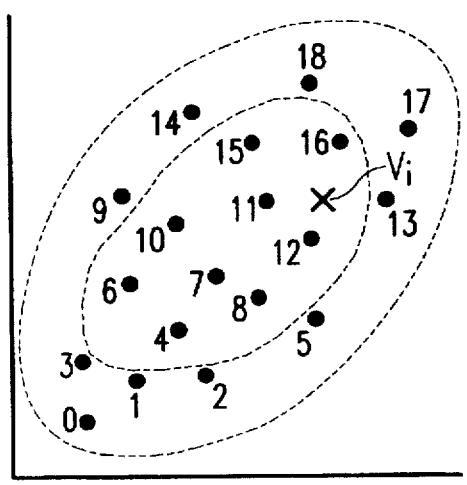
FIG. 4(a)
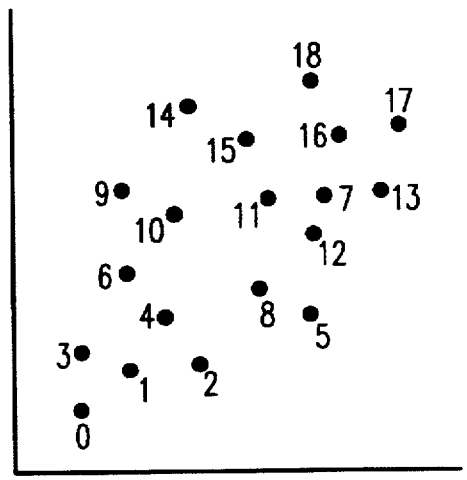
FIG. 4(b)

FIG. 7
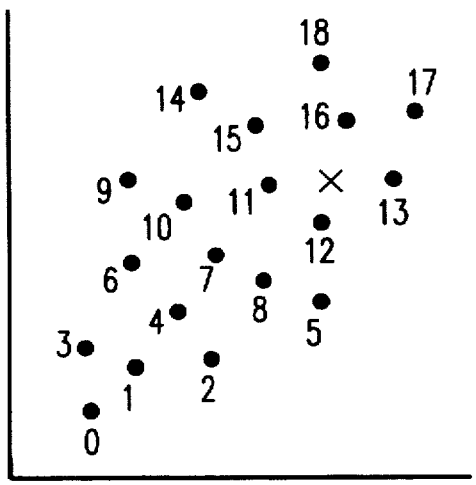
FIG. 8(a)
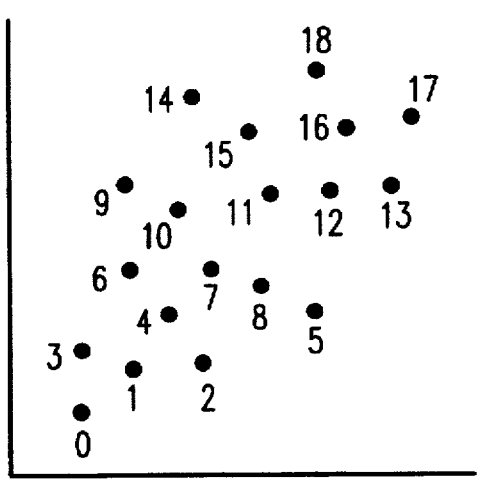
FIG. 8(b)

LEARNING VECTOR QUANTIZATION AND A TEMPORARY MEMORY SUCH THAT THE CODEBOOK CONTENTS ARE RENEWED WHEN A FIRST SPEAKER RETURNS

BACKGROUND OF THE INVENTION

1. Field of the Invention

The present invention relates to an encoding/decoding apparatus using vector quantization in which codebooks are used to efficiently compress speech or an image for transmission or recording.

2. Description of Related Art

Conventionally, types of vector quantization are known for efficiently compressing speech or an image for transmission or recording. According to these types of vector quantization, a signal waveform to be quantized is divided into sections, and then a waveform pattern for each section is represented by a code (index). In order to obtain the code, the vector quantization schemes use a comparison table that stores a variety of indexes representing a variety of waveform patterns. Each of the waveform patterns is expressed by an information vector having a dimension of a sampling number. This information vector is called a code vector, and a comparison table for the code vectors and indexes is called a codebook.

For example, CELP ("Code-Excited Linear Prediction: High Quality Speech at Very Low Bit Rates", by M. R. Schroeder and B. S. Atal, ICASSP, 1985), one of the speech encoding systems, is one known system. In CELP, prediction residual components of speech are divided into data called subframes. Each subframe has a size of about 40 samples, and is subjected to vector quantization.

Typically, the codebook that is used for vector quantization represents an average speaker among many speakers, and is not optimized for each individual speaker. As a result, there is a large error between the vector to be quantized and the vector in the codebook, and therefore it is difficult to reproduce speech with high quality. The number of vectors to be stored in a codebook may be increased to reproduce speech with high quality. However, the size of the codebook becomes substantially large, resulting in higher cost, increases in the amount of index information, and increases in the amount of data transmission. Also, a large sized codebook necessitates a long search time for searching through the codebook to find matching indexes.

Japanese Laid-open patent application HEI 2-22934 proposes an encoding transmission apparatus using a relatively small sized codebook to address the above problems. In this reference, the selection frequency in the selection of each pattern vector in a codebook is measured per a predetermined number of input blocks. Revised pattern vectors are generated based on pattern vectors that are weighted in proportion to the selection frequency, and the pattern vectors in the codebook are successively rewritten so that the codebook is adaptively corrected to reduce the error.

However, in the encoding transmission apparatus described above, the selection frequency in the selection of pattern vectors is observed for each one image frame to revise one vector. In other words, all the pattern vectors in the codebook are used to generate one revised vector based on the information of the selection frequency. As a result, the generated revised vector represents an average vector of all the inputted waveform vectors, and such a revised vector does not faithfully reflect each of the inputted waveform vectors. As a consequence, the codebook is not optimized for a signal that has relatively few spatial or time correlations. Consequently, the desired signal decoding is difficult to achieve.

Similar efforts are made to reduce the size of a codebook in Japanese Laid-open patent application HEI 2-186836. This reference describes a learning vector quantizer (LVQ) that uses a codebook containing a small amount of information. According to the learning vector quantizer, when the minimum distortion occurred at the time of vector quantization is larger than a predetermined value, the quantized vector is also sent to a decoding apparatus to rewrite a code vector in a codebook that has been selected in the past to adaptably renew the content of the codebook in response to the characteristics of the quantized vector. As a result, an original codebook that is made to be commonly applicable to many speakers is successively renewed so that the codebook becomes particular to an independent speaker through learning. Therefore, when the speaker changes, the codebook that has become particular to the previous speaker becomes troublesome and results in an increased error in vector quantization and deterioration in the decoded speech.

SUMMARY OF THE INVENTION

It is an object of an embodiment of the present invention to provide an encoding/decoding system employing vector quantization that uses a small sized codebook which faithfully represents each of the inputted waveform vectors to realize a high quality encoding and decoding with a decreased error.

It is another object of an embodiment of the present invention to provide an encoding/decoding system employing learning vector quantization that uses a small sized codebook and renews the content of the codebook so that the codebook becomes particular to an independent speaker. As a result, vector quantization errors do not substantially increase when the individual speaker changes.

In accordance with a preferred embodiment of the present invention, an encoding/decoding system employing vector quantization includes an encoding apparatus and a decoding apparatus, each having a codebook for storing information vectors representative of a predetermined number of signal patterns and indexes that determine the information vectors. The encoding apparatus compares a vector representing an object signal to be quantized with each information vector in the codebook, selects an information vector that is closest to the vector and outputs an index for the information vector. The decoding apparatus obtains an information vector corresponding to the index obtained at the encoding apparatus side by referring to the codebook and decodes the object signal. The decoding apparatus comprises an adjacent vector selection/observation device that detects the selection of a plurality of adjacent information vectors from the codebook within a predetermined time period, and an interpolation vector computation device that interpolates the information vectors based upon selection frequencies of the information vectors to generate an interpolated information vector based upon the detection of the plurality of adjacent information vectors. The interpolated information vector generated by the interpolation vector computation device is outputted as a decoding result.

In accordance with another embodiment of the present invention, the encoding apparatus and the decoding apparatus both has an adjacent vector selection observation device that detects the selection of a plurality of adjacent information vectors from the codebook within a predetermined time period. Both apparatuses each have an interpolation vector computation device that interpolates the information vectors based upon selection frequencies of the information vectors to generate a new information vector based upon the detection of the plurality of adjacent information vectors. Also, a codebook rewriting device is provided at both sides to rewrite one of the information vectors in the codebook with the new information vector generated by the interpolation vector computation device.

Further in accordance with a preferred embodiment of the present invention, an encoding/decoding system with vector quantization has an encoding apparatus and a decoding apparatus each having a codebook for storing code vectors representative of various typical signal patterns and indexes that determine the respective code vectors. The encoding apparatus compares an object signal to be quantized with each information vector in the codebook, selects an information vector in which a distance between the two vectors becomes the shortest and outputs an index thereof. The encoding apparatus selects a code vector in the codebook that most matches a vector of an object signal to be quantized and outputs an index corresponding to the code vector. The decoding apparatus obtains a code vector corresponding to the index obtained at the encoding apparatus by referring to the codebook and decodes the quantized vector. Further, the encoding apparatus and the decoding apparatus each have a codebook rewriting device for adaptively renewing the content of the codebook based upon a result of matching between the vector to be quantized and the code vector. In one embodiment, the system encoding/decoding with vector quantization includes an initialization codebook for storing an initial content of the codebook provided at both the encoding apparatus and the decoding apparatus. The encoding apparatus includes a characteristic extraction device that extracts characteristic parameters of the object signal to be encoded, and a characteristic change detection device that detects changes in the characteristic parameters extracted by the characteristic extraction device. The codebook rewriting device initializes the content of the codebook to the content of the initializing codebook when the characteristic change detection device detects the changes in the characteristic parameters.

In accordance with another preferred embodiment of the present invention, the system includes a temporary memory device for temporarily storing the content of the codebook and the characteristic parameters prior to the initialization of the codebook. The codebook rewriting device compares between the characteristic parameters extracted by the characteristic change detection device and the characteristic parameters stored in the temporary memory device when the characteristic change detection device detects a change in the characteristic parameters. The codebook rewriting device rewrites the content of the codebook with the content of the codebook stored in the temporary memory device when these parameters are approximate to each other, and moves the content of the codebook to the temporary memory device and initializes the codebook with the content of the initialization codebook when these characteristic parameters are not approximate to each other.

In one embodiment, the encoding apparatus may preferably supply initialization information indicating that the content of the codebook is rewritten with the content of the initialization codebook, and the decoding apparatus may initialize the content of the codebook with the content of the initialization codebook based upon being supplied with the initialization information.

Further in accordance with an embodiment of the present invention, the encoding apparatus may decode an encoded result to be outputted once, and then perform extraction of characteristic parameters with respect to the decoded result by using the characteristic extraction device and initialize the content of the codebook with the content of the initialization codebook when a change in the extracted characteristic parameters is detected. The decoding apparatus may decode the inputted encoded result, perform extraction of the characteristic parameters with respect to an encoded result by using the characteristic extraction device, and initialize the content of the codebook with the content of the initialization codebook when a change in the extracted characteristic parameters is detected.

When the object signal to be encoded is a speech signal, the characteristic change detection device controls the codebook rewriting device based upon at least one of changes in speech-tone/silence-tone of the speech signal, pitch, characteristic coefficient, spectrum envelope information and gain provided by the characteristic extraction device, as well as changes in speech-tone/silence-tone of the speech signal, pitch, characteristic coefficient, gain and vector quantization error provided from coding process performed by the encoding apparatus.

During the course of a telephone conversation, a different speaker may speak for a brief period of time, or other sounds such as a melody may temporarily occur during the conversation. Initialization of the codebook upon every occurrence of such changes is not efficient. To address this problem, a temporary memory device is provided for temporarily storing the content of a codebook and current characteristic parameters prior to the initialization of the codebook. When a change in characteristic parameters is detected, the characteristic parameters and the current characteristic parameters stored in the temporary memory device are compared. If they approximate to each other, a determination is made that an original speaker returns to the conversation, and the content of the codebook is rewritten with the content stored in the temporary memory device. On the other hand, if they do not approximate to each other, a determination is made that a speaker is different, and the codebook is initialized. As a result, when a different speaker temporarily speaks on the phone, a codebook with the previously learned result can be used. As a consequence, accurate vector quantization is performed.

Initialization of the codebook needs to be performed at both sides of the encoding apparatus and the decoding apparatus. However, initialization information may be transferred from the encoding apparatus to the decoding apparatus to enable initialization of the codebook of the decoding apparatus to occur in synchronism with the encoding apparatus.

Furthermore, when the encoding apparatus and the decoding apparatus are arranged so that the codebooks are initialized according to the same algorithm, the timing of the initialization at the encoding apparatus and the decoding apparatus can be synchronized without transferring initialization information such as the one described above from the encoding apparatus to the decoding apparatus. For example, within the encoding apparatus, an encoded result may be decoded once (local decoding), and characteristics are extracted with respect to the decoded result to detect a change. At the decoding apparatus, the encoded result that is received is decoded, and characteristics are extracted with respect to the decoded result to detect a change. In this manner, the same algorithm is applied to the same information to enable the synchronized initialization of the codebooks at the encoding apparatus and the decoding apparatus.

Other features and advantages of the invention will be apparent from the following detailed description, taken in

BRIEF DESCRIPTION OF THE DRAWINGS

FIG. 3 is used to describe the content of a codebook in either of an encoding apparatus and a decoding apparatus in accordance with an embodiment of the present invention.

FIGS. 4 (a) and 4 (b) are graphs showing simplified models of pattern vectors before and after the codebook is rewritten in accordance with an embodiment of the present invention.

FIG. 7 is used to explain contents of codebooks in an encoding apparatus and a decoding apparatus in accordance with a second embodiment of the present invention.

FIGS. 8 (a) and 8 (b) are graphs showing simplified models of code vectors before and after the contents of the codebook are renewed in accordance with a second embodiment of the present invention.

DETAILED DESCRIPTION OF EMBODIMENTS

Embodiments in accordance with the present invention are described below with reference to the accompanying drawings.

Figure 1:
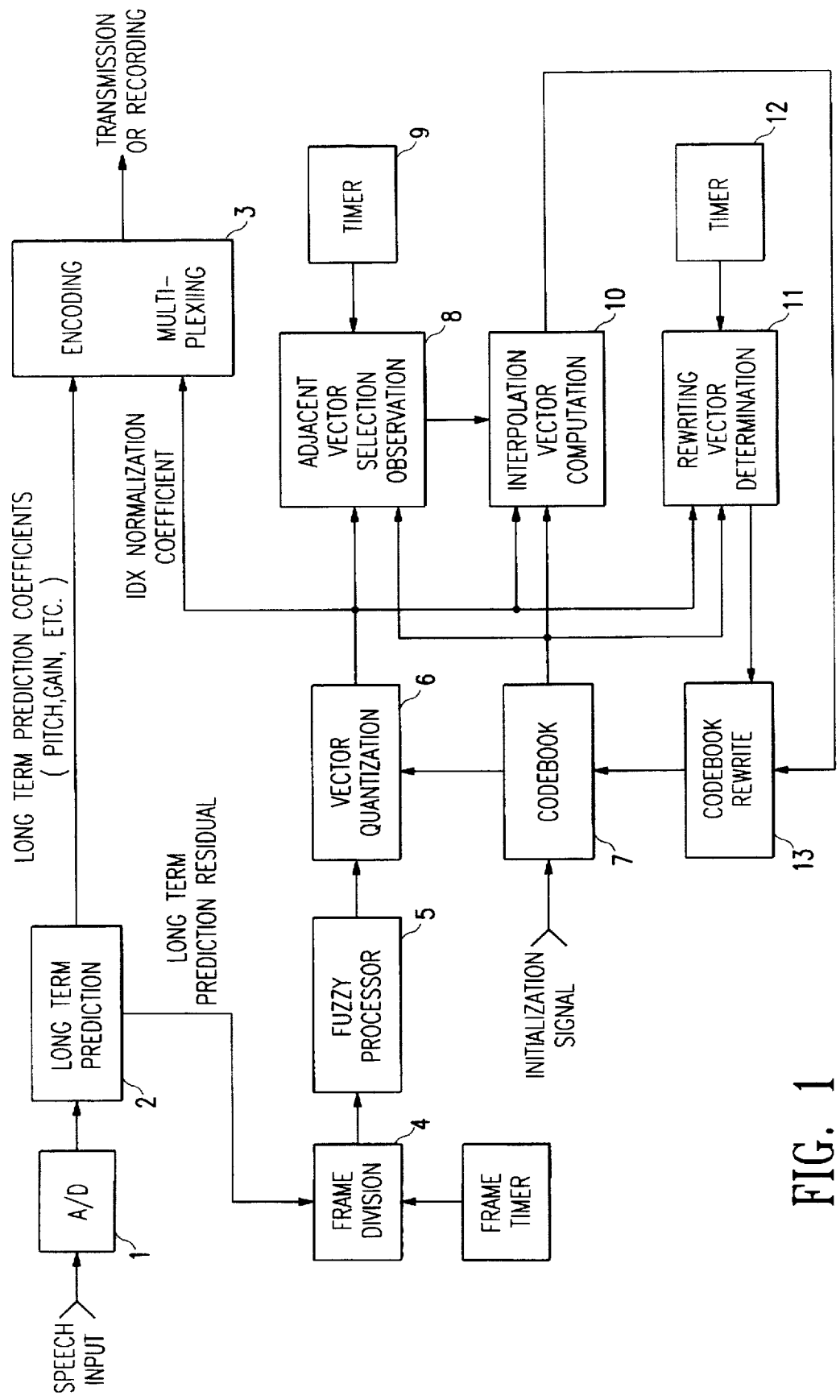
FIG. 1 is a block diagram of an encoding apparatus with vector quantization in accordance with an embodiment of the present invention.
Figure 2:
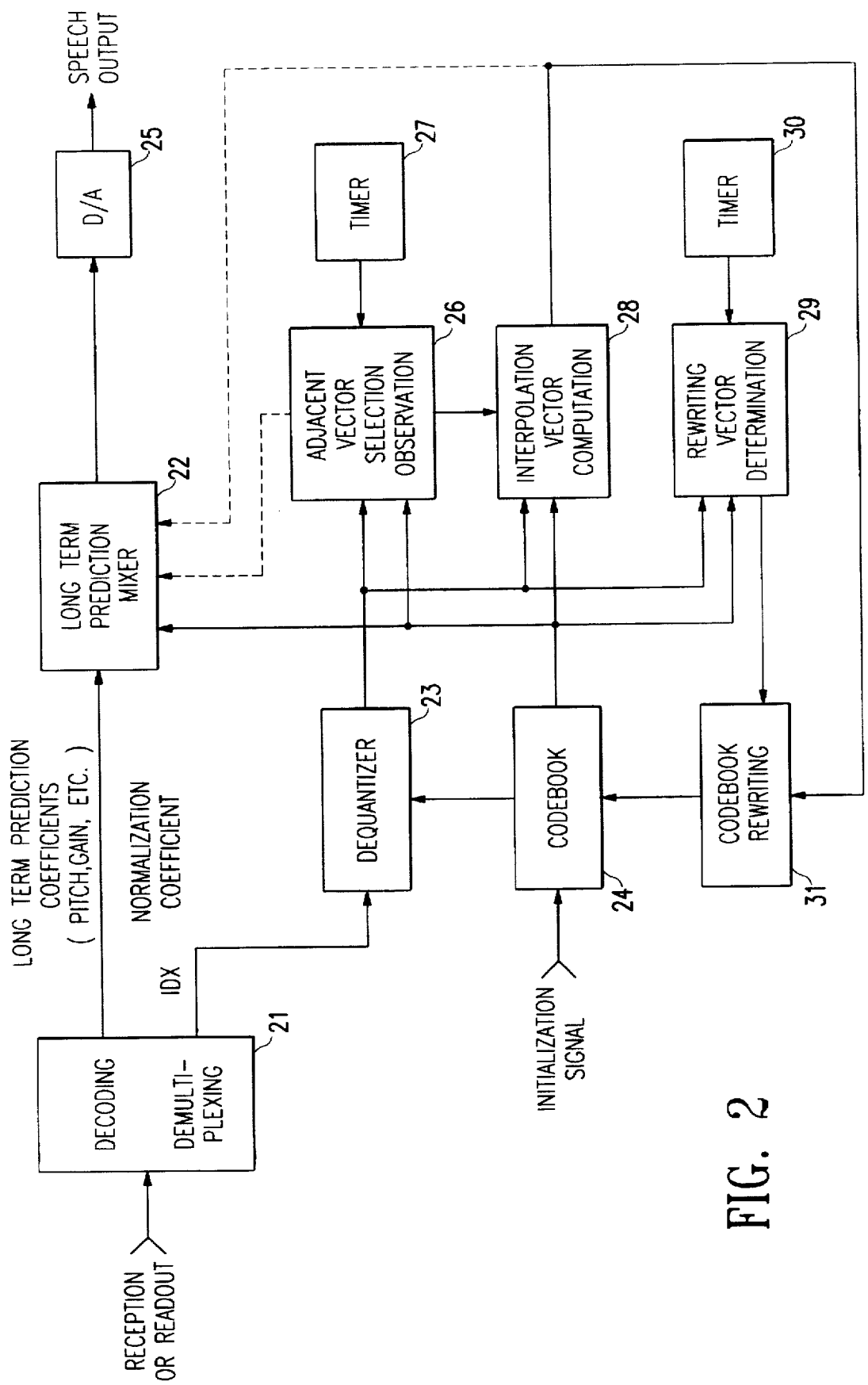
FIG. 2 is a block diagram of a decoding apparatus with vector quantization in accordance with an embodiment of the present invention.

FIG. 1 is a block diagram of an encoder apparatus for encoding a speech signal, using a vector quantization based on CELP method in accordance with an embodiment of the present invention. FIG. 2 is a block diagram of a decoder apparatus in accordance with an embodiment of the present invention.

As shown in FIG. 1, a speech signal that is inputted in the encoder apparatus is converted from analog to digital by an A/D converter 1, and then supplied to a long term predictor 2. At the long term predictor 2, the inputted digital speech signal is divided into frames each with a size of, for example, 160 samples. However, different frame size may be used in alternative embodiments. The long term predictor 2 analyzes each of the frames, and outputs long term predictor coefficients, such as PARCOR coefficients, and gain and pitch coefficients to an encoding/multiplexer 3. Also, the long term predictor 2 subtracts a signal linearly predicted by using the long term predictor coefficients from the inputted digital speech signal to obtain a long term residual component and outputs the same to a frame divider 4. The frame divider 4 divides the long term predictor residual component of 160 samples into sub-frames each with a size of 40 samples, and provides them to a fuzzy processor 5 as 40-dimensional predictor residual vectors. However, in alternative embodiments, different sub-frame sizes may be used. In a CELP method, these predictor residual vectors are subjected to quantization. The predictor residual vectors are provided to a vector quantizer 6 through the fuzzy processor 5. The vector quantizer 6 normalizes the predictor residual vector so that the size of the vector becomes one (1), searches through a codebook 7 to find a code vector that is closest in distance to the normalized predictor residual vector, and outputs an index IDX and a normalization coefficient thereof to the encoding/multiplexer 3. The encoding/multiplexer 3 encodes and multiplexes the long term prediction coefficient, IDX and the normalization coefficient, and transmits the same through a transmission system or records them on a recording medium.

On the other hand, at the decoder apparatus side as shown in FIG. 2, a received or read out signal is provided to a decoder/demultiplexer 21 for decoding and demultiplexing to divide the signal into a long term prediction coefficient and a normalization coefficient, and index IDX. The long term prediction coefficient and the normalization coefficient are provided to a long term prediction mixing device 22 and the index IDX is provided to a dequantizer 23.

The decoder apparatus has a codebook 24 having the same content as that of the encoder apparatus. The dequantizer 23 searches through the codebook 24 to find a code vector that corresponds to the supplied index IDX. The code vector read out from the codebook 24 is provided to the long term prediction mixing device 22. The long term prediction mixing device 22 returns the code vector selected from the codebook 24 to the original signal level by using the normalization coefficient, and mixes this signal with a signal that is obtained by linear prediction using the long term prediction coefficients. The mixed signal is converted digital to analog by a D/A converter 25 and is then outputted as a speech signal.

FIG. 3 is used to explain the codebooks 7 and 24 that are used in the above described encoding apparatus and decoding apparatus.

A codebook stores code vectors of, for example, 512 typical prediction residual components that are selected from a variety of languages and races and from both gender. However, in alternative embodiments, a different number of prediction residual components may be used. The codebook also stores indexes IDX, in one to one correspondence to the respective code vectors, that determine the respective code vectors and write prohibition flags that are described below. A great number of code vectors result in a reduced quantization error and thus high quality encoding and decoding. On the other hand, the memory storage capacity must be increased. As a result, the cost increases and a longer search time is required. Further, by the use of 512 code vectors, for example, 9-bits data may be transmitted as an index IDX. However, if the number of code vectors increases, the number of bits to be transmitted also increases.

Let us assume for the simplification of the explanation that the code vectors forming the codebook are 2-dimensional vectors. The vectors are plotted in a 2-dimensional plane in black dots as shown in FIG. 4(a). A number accompanying each of the dots is an index IDX of each corresponding code vector. When a vector Vi at the mark X in the figure is inputted in the vector quantizer 6 as a prediction residual vector, an index 12 is selected as a result of quantization because the vector Vi, that is located in the middle of code vectors V11, V12, V13 and V16, is located most closely to the vector V12.

However, when the vector Vi is fuzzed within the vector space, either of the code vectors V11, V12, V13 and V16 is selected with a specific selection frequency. The selection frequency corresponds to the distance between the vector Vi and each of the code vectors. The fuzzy processor 5 fuzzes the prediction residual vector within the vector space according to a predetermined probability distribution, for example, according to a normal distribution centered about the vector. The fuzzing width in this case may be set to a value that is half the average distance between the vector and the code vectors. If an inputted vector itself already contains a fuzziness, such as a prediction residual vector of speech, the fuzzy processor 5 may not be required.

An adjacent vector selection observing device 8 observes indexes IDX that are provided by the vector quantizer 6, and activates an interpolation vector computation device 10 when a plurality of adjacent vectors, such as code vectors V11, V12, V13 and V16, are selected within a predetermined time period that is set by a timer 9. For example, the code vectors V11, V12, V13 and V16 are selected with probabilities of 0.1, 0.2, 0.1 and 0.1, respectively. The interpolation vector computation device 10 carries out normalization so that the sum of the probabilities is 1.0, and weights each of the vectors and computes an interpolation vector Vx in the following manner:

$$Vx=0.2 \cdot V11+0.4 \cdot V12+0.2 \cdot V13+0.2 \cdot V16$$

The interpolation vector is registered in the codebook 7 as a new code vector. If the codebook 7 has a spare capacity, the new code vector that is generated may be simply added to the codebook 7. However, the capacity of the codebook 7 should preferably be as small as possible from the view point of the cost and search time. In this respect, a rewriting vector determination device 11 is used to select a code vector with the lowest selection frequency within a specified unit time period determined by the timer 12 as a rewriting vector.

It should be noted that there may be vectors with a low selection frequency in which interpolation process cannot be performed if such vectors are rewritten. For example, such vectors include a vector located adjacent the outer edge of a cluster of vectors within a vector space that is circled by dotted line as shown in FIG. 4 (a). If such a vector is rewritten, an interpolation vector cannot be generated at an inner location of the vector. Therefore, the rewriting vector determination device 11 avoids selection of such a primitive vector as a rewriting vector by, for example, referring to the rewrite prohibition flags of the codebook 7, adding weight that indicates the degree of rewriting impossibility or adding weight to the selection frequency.

A codebook rewriting device 13 replaces the interpolation vector computed by the interpolation vector computation device 10 with the rewriting vector determined by the rewriting vector determination device 11 to thereby renew the content of the codebook 7. FIG. 4 (b) shows an example in which an interpolation vector generated from the prediction residual vector Vi in FIG. 4 (a) is replaced with a code vector of the lowest selection frequency V7.

The above encoder apparatus includes the adjacent vector selection observation device 8, the timers 9 and 12, the interpolation vector computation device 10, the rewriting vector determination device 11 and the codebook rewriting device 13. In a similar manner, the decoder apparatus has an adjacent vector selection observation device 26, timers 27 and 30, an interpolation vector computation device 28, a rewriting vector determination device 29 and a codebook rewriting device 31.

As a result, when each of the devices is operated in a manner described above, the codebooks 7 and 24 can always maintain the same contents without the necessity of transmitting information about renewal of the codebooks 7 and 24 between the encoding apparatus and the decoding apparatus.

By renewing the codebooks 7 and 24 in this manner, the content of the codebook can be adaptively changed in response to the characteristics of a speaker. However, when the power is turned on, or when a speaker is changed so that the characteristics of the inputted speech drastically change, the content of the codebook changed by learning may cause inconsistencies. In such a case, an initialization signal or the like may be used to reset the changed content of the codebooks 7 and 24 to the original content. Initial data of the codebook may be stored in an independent ROM. In another embodiment, only information of the vectors that are rewritten may be stored in spare regions in the codebooks 7 and 28, and the content may be recovered based on an initialization signal.

In accordance with the above embodiment, the content of the codebook is renewed. However, the same effects may be obtained without renewing the content of the codebook. In order to achieve such a scheme, instead of providing a code vector from the codebook 24 to the long term prediction mixing device 22 shown in FIG. 2, an interpolation vector computed by the interpolation vector computation device 28 is provided to the long term prediction mixing device 22 as shown by dotted lines in FIG. 2. The long term prediction mixing device 22, when and after the adjacent vector selection observation device 26 detects the selection of adjacent vectors, generates mixed signals, using the interpolation vector each time the indexes IDX of the vectors are inputted.

In accordance with the structure described above, the adjacent vector selection observation device 8, the timers 9 and 12, the interpolation vector computation device 10, the rewriting vector determination device 11 and the codebook rewriting device 13 may not be required on the encoding apparatus side. Also, the rewriting vector determination device 29, the timer 30 and the codebook rewriting device 31 may not be required on the decoding apparatus side.

In the above embodiments, an example of vector quantization using prediction residual vectors of a speech signal is described. However, it should be appreciated that the present invention is applicable to vector quantization of a speech signal itself or of an image signal.

As described above, in accordance with the above embodiment, an adjacent vector selection observation device provided at the decoding apparatus side detects that a plurality of adjacent information vectors are selected, and an interpolation computation device carries out interpolation based on the selection frequencies of the plurality of adjacent information vectors and generates an interpolated vector. Since information of the interpolated vector is used as a decoding result, the decoding result has a close similarity to each of the original signals. As a result, the present invention provides a high quality encoding/decoding system with a reduced codebook storage capacity which faithfully reproduces each input waveform vector with reduced quantization errors.

In accordance with another embodiment of the present invention, instead of using an interpolated vector as a decoding result, an interpolated vector is obtained in the same procedure both at the encoding apparatus side and the decoding apparatus side, and codebooks provided at the both sides are renewed by the obtained interpolated vector. As a result, the codebooks are optimized based on each input waveform vector, and therefore a high quality encoding/decoding is realized with a reduced codebook storage capacity in which each input waveform vector is faithfully reproduced with reduced errors.

Figure 5:
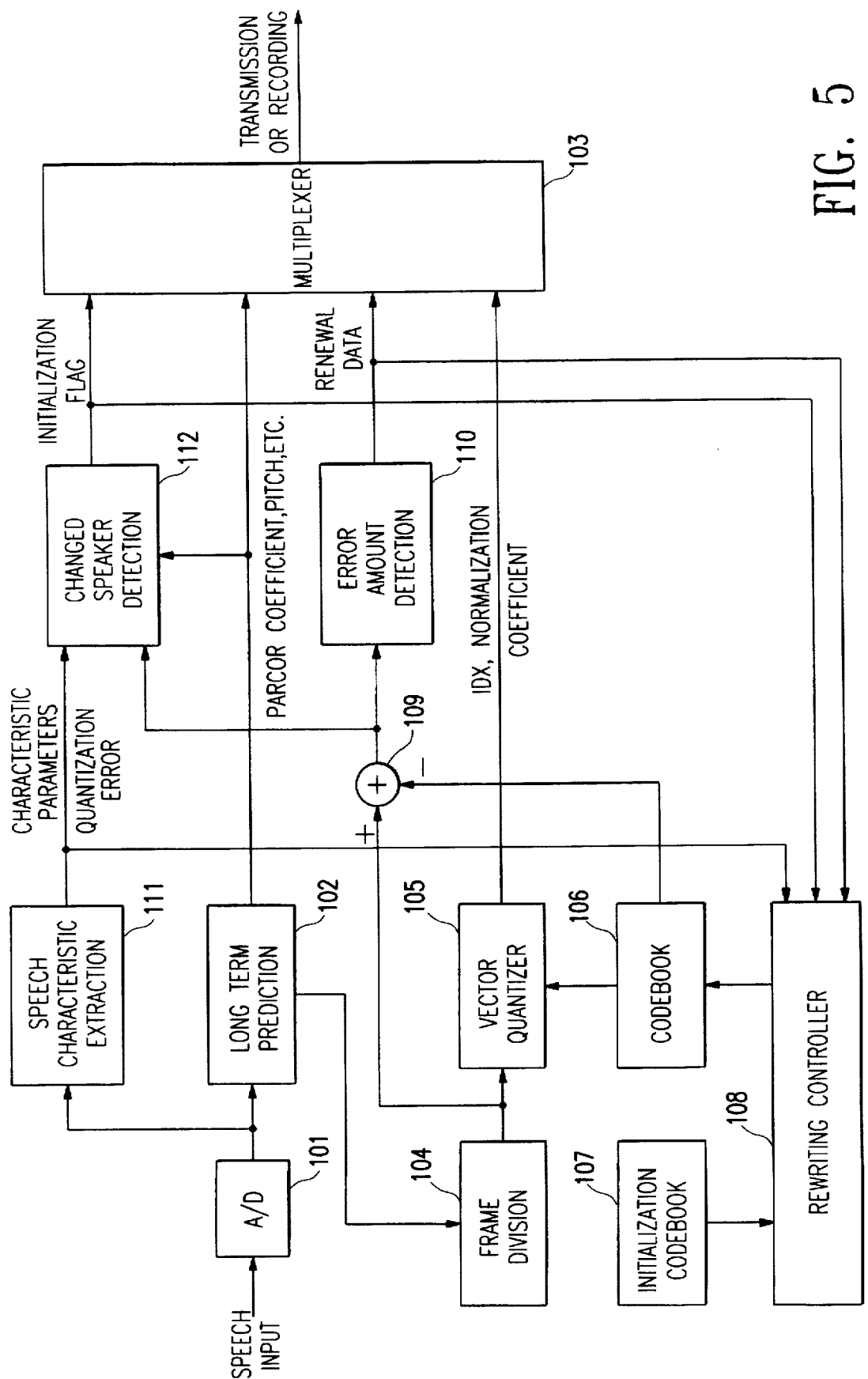
FIG. 5 shows a block diagram of an encoding apparatus with vector quantization in accordance with a second embodiment of the present invention.
Figure 6:
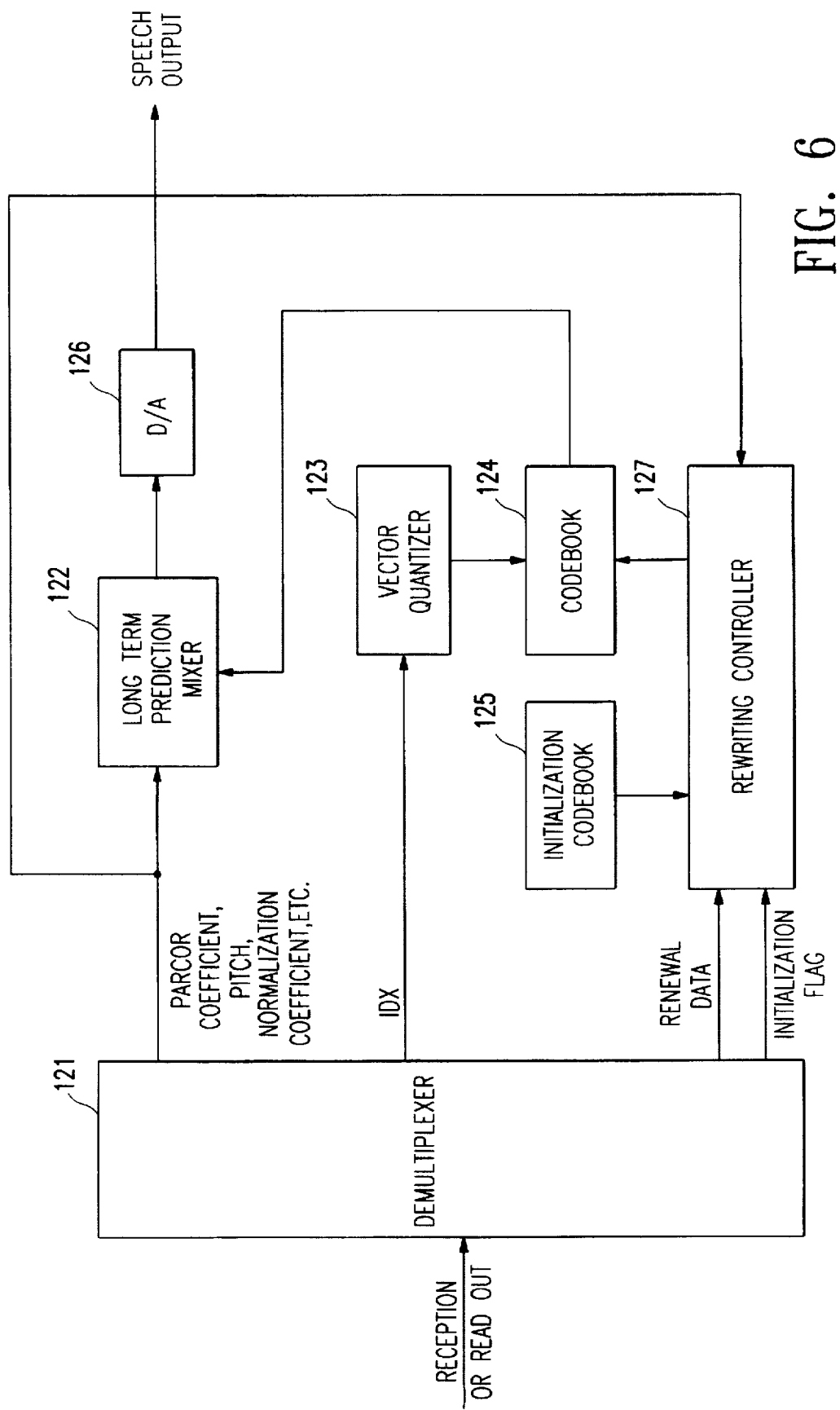
FIG. 6 shows a block diagram of a decoding apparatus with vector quantization in accordance with a second embodiment of the present invention.

FIG. 5 is a block diagram of an encoder apparatus for encoding a speech signal, using vector quantization based on the CELP method in accordance with a second embodiment of the present invention. FIG. 6 is a block diagram of a decoder apparatus, using vector quantization based on the CELP method in accordance with a second embodiment of the present invention. As shown in FIG. 5, a speech signal, an object signal to be encoded, is inputted in the encoder apparatus. The speech signal is converted analog to digital by an A/D converter 101, and supplied to a long term predictor 102 and a characteristic extraction device 111. The long term predictor 102 divides the inputted digital speech signal into frames with each size of, for example, 160 samples. However, in alternative embodiments, different frame sizes may be used. The long term predictor 102 analyzes each frame, and outputs long term predictor coefficients, such as PARCOR coefficients, and gain and pitch coefficients to a multiplexer 103.

Also, the long term predictor 102 subtracts a signal that is linearly predicted by using the long term predictor coefficients from the inputted digital speech signal to obtain a long term residual component and outputs the same to a frame divider 104. The frame divider 104, by using a frame timer, divides the long term predictor residual component of each 160 samples into sub-frames with each size of 40 samples, and provides them to a vector quantizer 105 as 40-dimensional predictor residual vectors. However, in alternative embodiments, different sub-frame sizes may be used. In CELP, these predictor residual vectors are subjected to vector quantization. The vector quantizer 105 normalizes the predictor residual vector so that the size of the vector becomes one (1), searches through a codebook 106 to find a code vector that is closest in distance to the normalized predictor residual vector, and outputs index IDX and a normalization coefficient to the multiplexer 103.

Also, the encoder apparatus is provided, in addition to the codebook 106, with an initialization codebook 107 that stores data to be used when the codebook 106 is initialized. The content of the codebook 106 is successively renewed by a rewriting controller device 108. For this reason, the codebook 106 is made from a rewritable memory, such as RAM or the like. In contrast, the content of the initialization codebook 107 is fixed, and therefore it is made from a memory such as ROM or the like.

A subtracter 109 calculates an error between a predictor residual vector that is provided into the vector quantizer 105 and a code vector that has been selected as a result of the vector quantization. The subtracter 109 provides an error vector representing the error between the predictor residual vector and the selected code vector to an error amount detecter 110. The error amount detecter 110 provides an error transmission flag of "1" when the error vector is larger than a predetermined level, and supplies the flag and the error vector as renewal information to a rewriting controller 108 and the multiplexer 103. As a result, the rewriting controler 108 controls to rewrite the content of the codebook 106 based upon the renewal information. If the error vector is smaller than the predetermined level, the error amount detecter 110 provides an error transmission flag of "0", and supplies this flag to the rewriting controller 108 and the multiplexer 103.

Also, the speech characteristic extraction device 111 extracts characteristic parameters from the speech signal. The characteristic parameters are information characteristic to an individual speaker and represent changes in voiced-tone/silence-tone of the speech signal, pitch, characteristic coefficient, spectrum envelope information and gain. The characteristic parameters are supplied to a changed speaker detecter 112. The changed speaker detector 112 detects changes in the parameters that indicate the change of the speaker, and provides an initialization flag of "1" when a change is detected. The initialization flag is also supplied to the rewriting controler 108. The rewriting controler 108 initializes the codebook 106 and changes the content with the content from the initialization codebook 107 when the initialization flag is "1".

The multiplexer 103 encodes and multiplexes the long term predictor coefficient, IDX and its normalization coefficient, rewriting information and initialization flag, and transmits them through a transmission system or records them on a recording medium.

At the decoding apparatus side, as shown in FIG. 6, a signal that is received or a read out, is supplied to a demultiplexer 121 for decoding and demultiplexing so that the signal is divided into a long term predictor coefficient, a normalization coefficient, index IDX, rewriting information and initialization flag. The long term predictor coefficient and the normalization coefficient are supplied to a long term prediction mixer 122.

The decoding apparatus also has a codebook 124 and an initialization codebook 125 that store the same contents of the codebook 124 and the initialization codebook at the encoding apparatus, respectively. A vector quantizer 123 refers to the codebook 124 based on the supplied index IDX and selects a code vector accordingly. The code vector is outputted from the codebook 124 and supplied to the long term prediction mixer 122. The long term prediction mixer 122 returns the code vector to a signal having the original level, using the normalization coefficient, mixes the signal with a signal that is obtained through linear prediction, using the long term predictor coefficients, to provide a mixed signal. Then the mixed signal is converted digital to analog by a D/A converter 126 and outputted as a decoded speech signal.

Also, the renewal information and the initialization flag that are divided by the demultiplexer 121 are supplied to a rewriting controller 127. The rewriting controller 127 has the same function as that of the rewriting controller 108 at the encoder apparatus side. The rewriting controller 127 renews the content of the codebook 124 based upon the rewriting information, and initializes the content of the codebook 124 with the content from the initialization codebook 125 based upon the value of the initialization flag.

An operation of the encoding apparatus configured in this manner is described below.

When speech is inputted, characteristic portions thereof, such as PARCOR coefficient, pitch and gain, are extracted by the long term predictor 102 and the characteristic extraction device 111. The remaining residual components are encoded and decoded by using the codebook 106 and codebook 124, respectively.

FIG. 7 shows contents of the codebooks 106 and 124.

The codebooks 106 and 124 in their initialized state store code vectors of, for example, 512 typical prediction residual components that are selected from a variety of languages and races and from both gender so that the codebook is generally applicable to many and unspecified speakers. However in alternative emboidments, a different number of prediction residual components may be used and the components may be specialized. The codebooks 106 and 124 also store indexes IDX, in one to one correspondence to the respective code vectors, that determine the respective code vectors. In one embodiment, flags that indicate write prohibition or write enable, and weighting information for selection priority with respect to each code vector may be added.

A large number of code vectors result in reduced quantization errors and thus provide high quality encoding and decoding. On the other hand, the memory storage capacity must be increased. As a result, the cost increases and a longer search time is required. Further, by the use of, for example, 512 code vectors, 9-bits data may be transmitted as an index IDX. However, if the number of pattern vectors increases, the number of bits to be transmitted also increases.

Let us assume for the simplification of the explanation that the code vectors forming the codebook are 2-dimensional vectors. The vectors are plotted in a 2-dimensional plane in black dots as shown in FIG. 8(a). A number accompanying each of the dots is an index of each corresponding code vector. When a vector Vi at the mark X in the figure is inputted in the vector quantizer 105 as a predictor residual vector for quantization, an index V12 is selected as a result of quantization because the vector Vi is located closest to the vector V12.

The residual components that are inputted in the vector quantizer 105 tend to be characteristic to each individual speaker. Therefore, the code vectors in the codebooks 106 and 124 need to be renewed for optimization through learning. In this respect, when the error amount detecter 110 within the encoding apparatus detects that quantization errors for specific code vectors continuously exceed a predetermined level, the code vector selected from the codebook 106 and an average value of the quantization errors are added to provide a new code vector that is replaced with the originally selected code vector to thereby renew the contents of the codebook 106. At this moment, the error transmission flag of "1" and the average value of the quantization errors are transmitted to the decoding apparatus to renew the content of the codebook 124. FIG. 8 (b) shows an example in which a new code vector generated based on the quantization error is replaced with the code vector V12 shown in FIG. 8 (a). In another embodiment, the new code vector may be replaced with a code vector that is least frequently selected per a predetermined period of time. In such a case, flags that prohibit replacement may be added to the primitive code vectors that exist adjacent the edge of the vector space. In another embodiment, the process of renewing the codebook 124 may be performed by varying weight of each code vector, instead of rewriting the code vectors.

By renewing the codebooks 106 and 124 in this manner, the content of the codebooks can be adaptively changed in response to the characteristics of a speaker. However, when the power is turned on, or when the speaker is changed, the characteristics of the inputted speech may drastically change. As a result, the content of the codebook changed through learning may cause inconsistencies. In this case, the contents of the codebooks 106 and 124 are preferably initialized with the initial content.

To determine whether or not the speaker changes, the speech characteristic extraction device 111 extracts characteristic parameters of an individual speaker from a speech signal, and the changed speaker detection device 112 detects changes in the speaker's characteristic parameters. The speaker's characteristic parameters may include:

(a) Voiced-tone/silence-tone

The ratio between voiced-tone and silence-tone varies depending upon an individual speaker. When there is a portion of silence longer than an average silence occurring in an ordinary speech of a typical speaker, there is a high probability that the speaker has changed.

(b) Pitch of voice

The pitch of voice represents the frequency of the vocal cords and thus the pitch of the spoken sound. Therefore, the distribution of the frequency (time average, dispersion, etc.) reflects the characteristics of an individual person.

(c) Characteristic coefficients of voice

There is, among characteristic coefficients of voice, PARCOR coefficient (reflection coefficient) that represents the vocal tract by an all-pole type filter. The time average and dispersion thereof are different from one speaker to another.

(d) Spectrum envelope

A spectrum envelope is obtained by analyzing the frequency of a voice. The shape of the spectrum envelope, the time variation rate and the dispersion of the time variation have a tendency similar to that of item (c) described above.

(e) Voice gain

Voice gain differs according to the habit of a speaker. The variation rate (dispersion) of the gain can also be used for the determination of an individual speaker, because the variation rate of the gain also differs in response to the intonation of an individual speaker.

(f) Vector quantization error

Quantization error increases if a first speaker changes when a codebook has been specialized for the first speaker. Therefore, changes in the quantization errors may be observed to determine a change of speakers.

The above-described parameters may be those extracted by the characteristic extraction device 111 or those obtained during the process of vector quantization. For example, according to the CELP encoding system, pitch, PARCOR coefficients, gain, voiced tone/silence tone flags are generated within the CELP algorithm. Therefore these parameters can also be used. In an encoding/decoding system in which spectrum analysis is performed to obtain envelope information, and the information is compressed by using the envelope information, the spectrum envelope parameter of the above-described item (d) can be utilized as is.

When these parameters are inputted to the changed speaker detection device 112, the changed speaker detection device 112 first performs pre-processing, such as filtering the inputted parameters by a low pass filter (LPF). The quantization error may temporarily increase when a person speaks in a different manner, and the pitch or characteristic coefficients may temporarily change when a person whistles. Filtering the inputted parameters substantially prevents these temporary quantization errors or temporary changes in the pitch or characteristic coefficients from being determined as a change in the speaker. Then, a total evaluation value (etotal) is obtained, for example, according to the following determination formula.

[Formula 1]

$$etotal = ka\ Pa + kb\ Pb + kc\ Pc + kd\ Pd + ke\ Pe + kf\ Pf$$

where Pa through Pf are parameters and
ka through kf are weighting coefficients for evaluation of the parameters.

The total evaluation value (etotal) is subjected to a post-process in which the total evaluation value is filtered by another low pass filter (LPF), and compared with a predetermined threshold value. If the total evaluation value exceeds over the threshold value, a determination is made that the speaker has changed.

When the changed speaker detection device 112 detects a change of speaker, the initialization flag becomes "1", and the rewriting controller 108 initializes the content of the codebook 106 with the content of the initialization codebook 107. As the initialization flag may be transmitted or recorded, the codebook 124 at the decoding apparatus is also initialized in the same manner.

In this example, the entire contents of the codebooks 106 and 124 may be rewritten. However, in consideration of the rewriting efficiency, and in order to reduce the amount of data that are rewritten, prohibition flags may be added to primitive code vectors that do not well represent, for example, personal information.

Also, in addition to the initialization flag, characteristic parameters such as pitch information may be supplied to the rewriting controller 108 to make a determination as to whether the speaker's voice is a male voice or a female voice. Based upon the determination result, the initial values of the codebook may be initialized with typical male values or typical female values. As a result, vector quantization errors can be reduced after the speaker changes.

As described above, the initialization codebooks 107 and 125 may be formed by ROMs or the like to store the entire initialization data. However, in another embodiment, the initialization codebooks 107 and 125 may be formed by rewritable memories to store only information vectors that are rewritten. In another embodiment, even when the initialization codebooks 107 and 125 store the entire initialization data, the codebooks 106 and 124 may be rewritten only with data that are rewritten to shorten the rewriting time.

Figure 9:
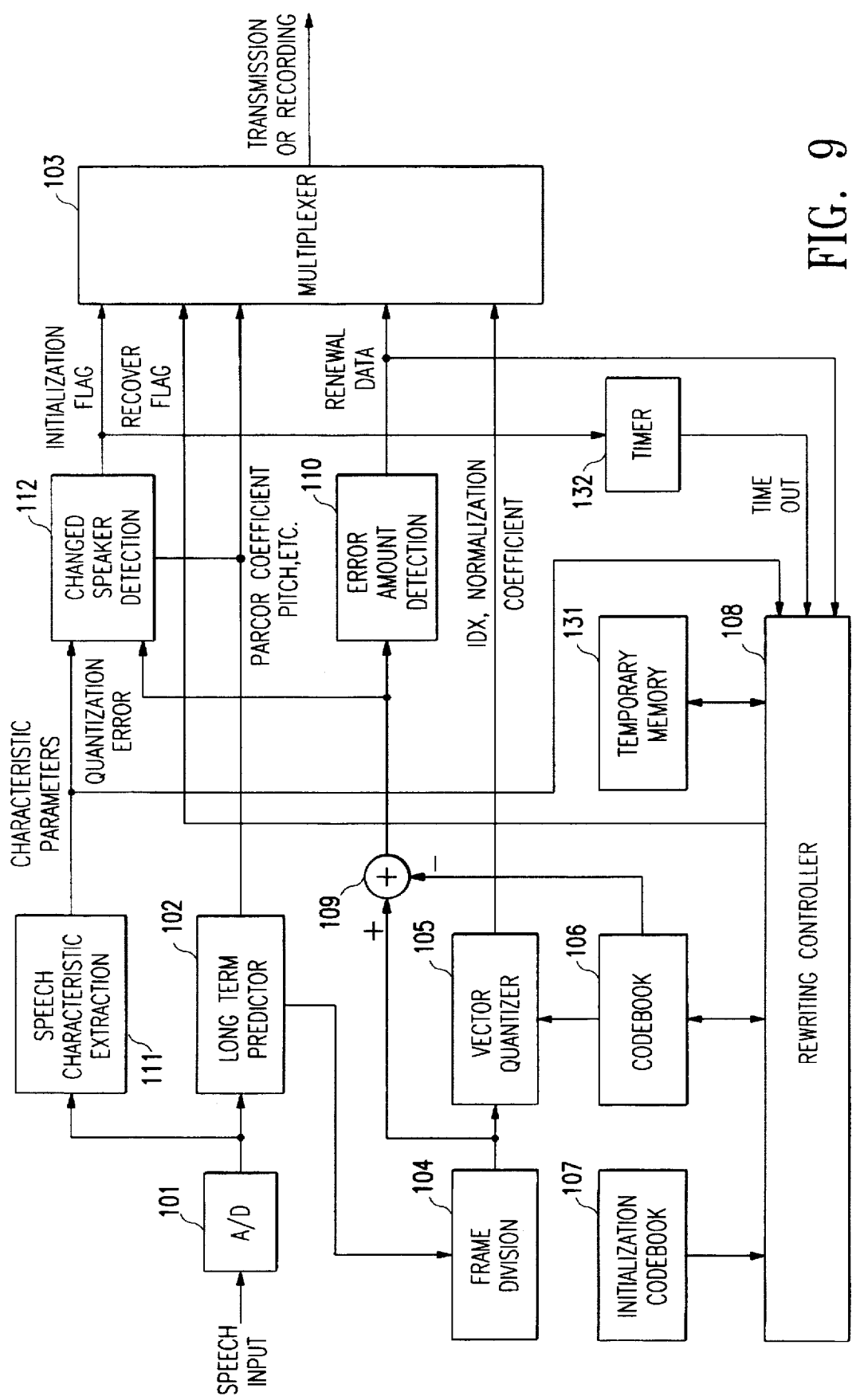
FIG. 9 shows a block diagram of an encoding apparatus using vector quantization in accordance with a third embodiment of the present invention.

FIG. 9 shows a block diagram of an encoding apparatus in an encoding/decoding apparatus in accordance with a third embodiment of the present invention.

The system in accordance with this embodiment is different from the system described above in that this system has a temporary memory 131 for temporarily storing a codebook and characteristic parameters and a timer 132 for measuring the time duration for such a temporary storage.

During telephone conversation, a speaker may change for a brief period of time to a different speaker. In this instance, the initialization flag becomes "1". The rewriting controller 108 then moves the characteristic parameters of the current speaker and the content of the codebook 106 to the temporary memory 131 for temporary storage before the content is rewritten, activates the timer 132, and initializes the content of the codebook 106. The timer 132 may be set to a time period of, for example, several minutes. If the initialization flag becomes "1" before the set time has been counted up, the characteristic parameters temporarily stored in the temporary memory 131 and characteristic parameters that are currently extracted are compared. If these parameters approximate each other, a determination is made that the original speaker has resumed the conversation, and the codebook 106 is rewritten with the content temporarily stored in the temporary memory 131. If the set time has been counted up when the speaker has changed, a determination is made that there is a low probability that the original speaker resumes conversation. Accordingly, the content of the codebook 106 and the characteristic parameters are temporarily moved, and the codebook 106 is initialized. When the speaker changes, the current characteristic parameters and the temporarily stored characteristic parameters are compared. If these parameters do not approximate each other, a determination is made that a new speaker has started the conversation. Accordingly the content of the codebook 106 and the characteristic parameters are temporarily moved, and thereafter the codebook 106 is initialized.

The following formula is used to determine if the parameters approximate each other.

$$d \text{ person} = \sqrt{|ka'(Pma-Pa)^2 + kb'(Pmb-Pb)^2 + \ldots + kf'(Pmf-Pf)^2|} \qquad \text{[Formula 2]}$$

where
 d person is an evaluation value representing if the parameters approximate each other;
 Pma through Pmf are parameters that are temporarily stored;
 Pa through Pf are parameters that are obtained after the speaker changes; and
 ka' through kf' are determination weighting coefficients for the respective parameters.

As to the parameters Pma through Pmf and Pa through Pf, a pre-processing such as filtering by low pass filters (LPF) may be performed.

In order to maintain the consistency between the codebook 106 of the encoding apparatus and the codebook 124 of the decoding apparatus, the encoding apparatus may transmit or record, in addition to the initialization flag, a restore flag for indicating that the content of the temporary memory 131 is restored. The decoding apparatus accordingly restores or initializes the content of the codebook 124.

Figure 10:
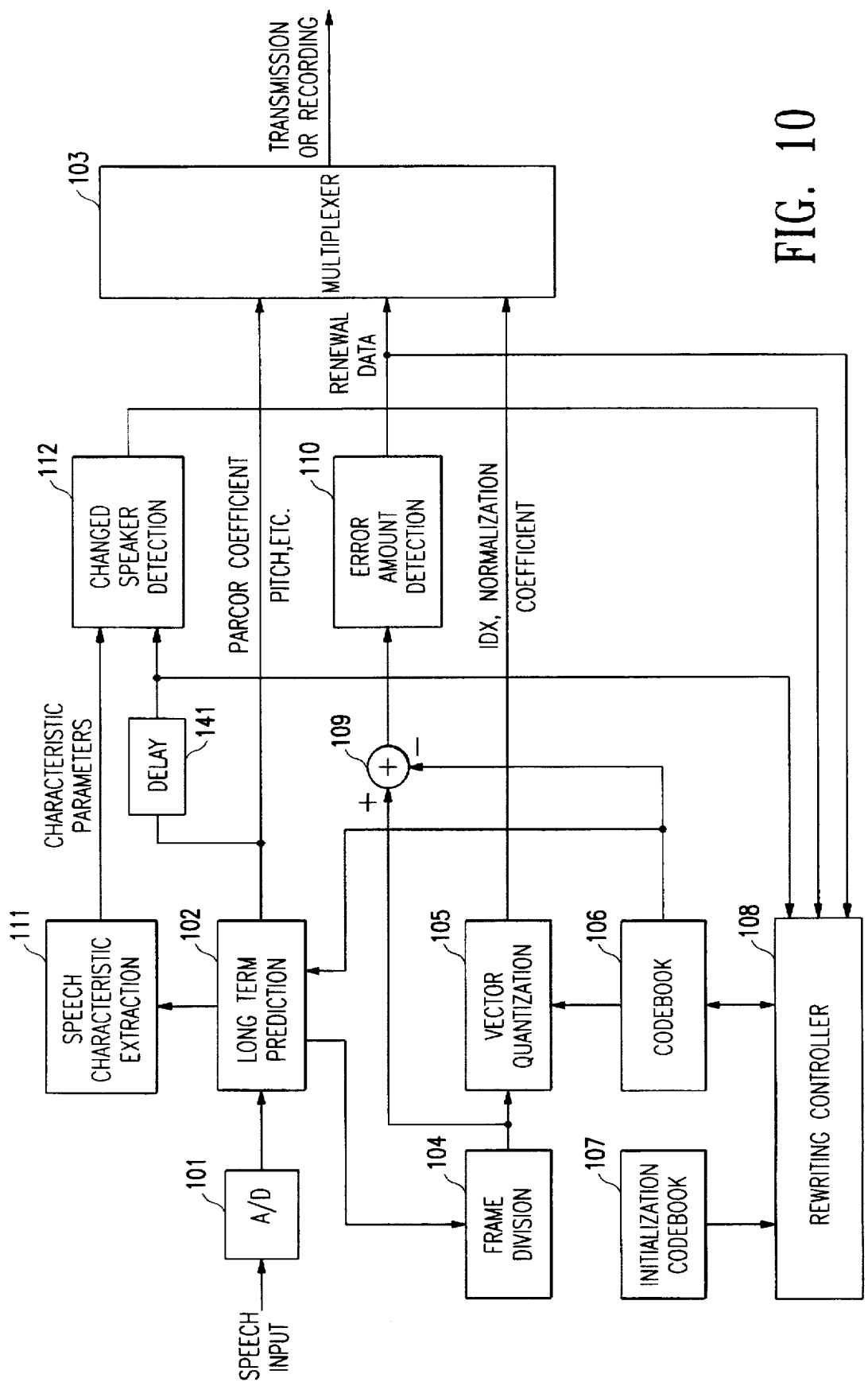
FIG. 10 shows a block diagram of an encoding apparatus using vector quantization in accordance with a fourth embodiment of the present invention.
Figure 11:
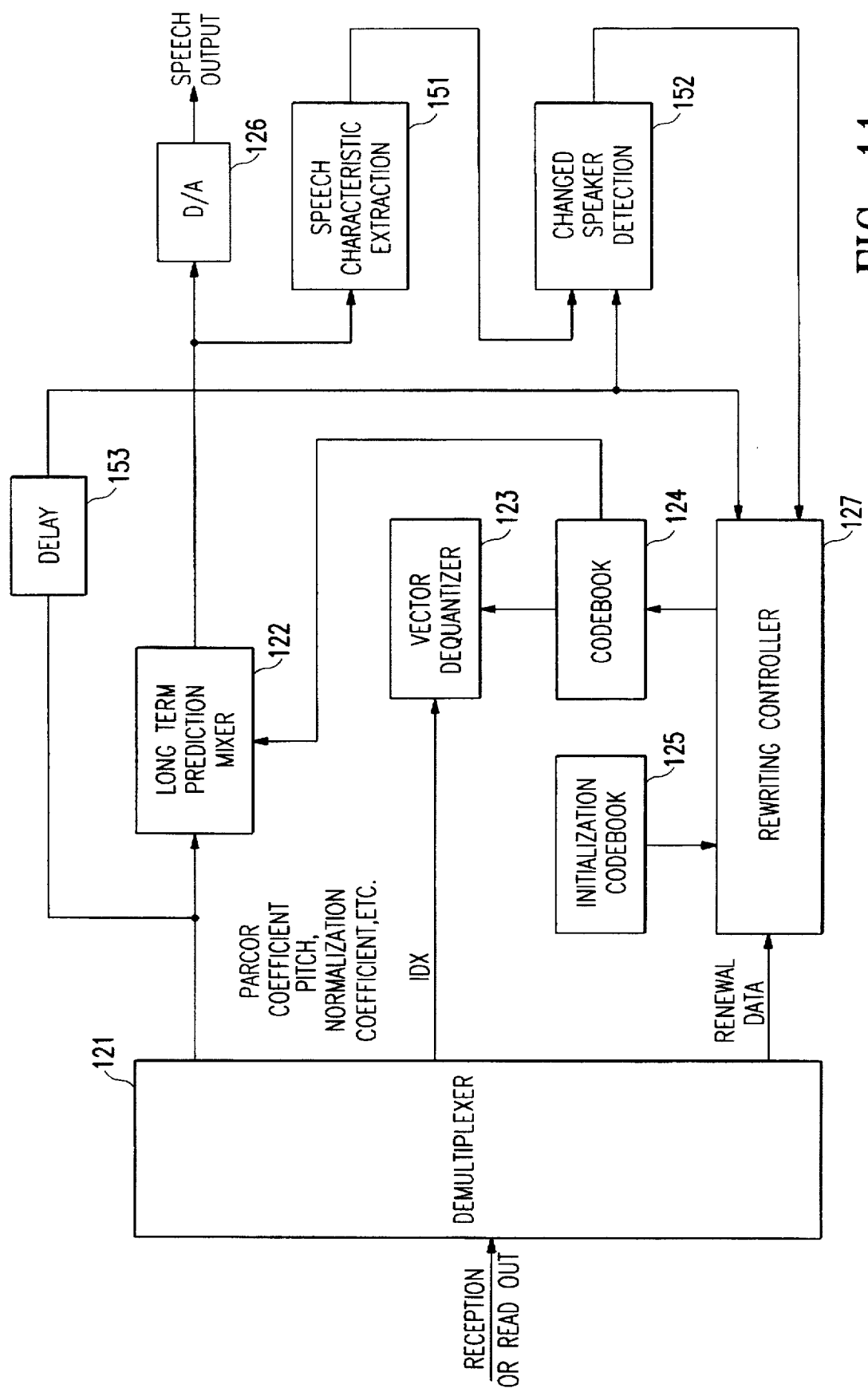
FIG. 11 shows a block diagram of a decoding apparatus in accordance with a fourth embodiment of the present invention.

In accordance with the embodiments described above, the initializing flag and the restore flag are supplied from the encoding apparatus to the decoding apparatus. However, if this information is generated at the encoding apparatus and the decoding apparatus according to the same algorithm, transmission of such information is not required. FIGS. 10 and 11 show such a system.

FIG. 10 shows a block diagram of an encoding apparatus and FIG. 11 shows a block diagram of a decoding apparatus in accordance with a fourth embodiment of the present invention.

For example, when an analysis-by-synthesis method, such as a CELP method, is used, a synthesized voice is reproduced once within the encoding apparatus. Hereafter, the synthesized voice is labeled locally decoded data. When the long term predictor device 102 obtains a predictor residual vector, the long term predictor 102 generates locally decoded data. The locally decoded data coincides with data that is decoded by the decoding apparatus. Therefore, at the encoding apparatus side, the speech characteristic extraction device 111 extracts characteristic parameters from the locally decoded data. The extracted characteristic parameters and characteristic coefficients obtained by the long term predictor 102, and the pitch are supplied to the changed speaker detector 112 for detecting a change in the characteristic parameters. A delay device 141 is used to compensate for a delay in the vector quantization process.

Similarly, in the decoding apparatus, the speech characteristic extraction device 151 extracts characteristic parameters from the decoded data provided by the long term mixing device 122. The extracted characteristic parameters are supplied to the changed speaker detection device 152, and the information including the characteristic parameters and the pitch that are received or read out are supplied through the delay device 153 to the changed speaker detection device 152. As a result, the change of the speaker is detected based upon the same data and with the same algorithm used on the encoding apparatus side; and therefore, the initialization flag is not required to be supplied from the encoding apparatus to the decoding apparatus. As a consequence, the amount of data transmission or data memory capacity can be reduced.

In the above embodiments, predictor residual vectors of the speech signal are vector quantized. However, a speech signal itself or an image signal itself can also be subjected to a similar vector quantization.

As described above, In an encoding/decoding system with a learning vector quantization in accordance with embodiments of the present invention that rewrites the content of a codebook based upon a result of matching between a vector to be quantized and a code vector, a change in characteristic parameters of the object signal to be encoded is detected. When such a change is detected, the system determines that a speaker is changed and accordingly initializes the contents of the codebook. As a result, the contents of the codebook are made applicable to an average speaker after the speaker has changed. Accordingly, an increase in the vector quantization error can be prevented.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A system of encoding/decoding with vector quantization including an encoding apparatus and a decoding apparatus each having a codebook for storing a plurality of information vectors and index that determine the information vectors, the encoding apparatus comparing a vector of an object signal to be quantized with each information vector in the codebook, selecting an information vector that is closest to the vector of the object signal and outputting an index of the selected information vector, the decoding apparatus referring to the codebook to obtain an information vector corresponding to the index obtained by the encoding apparatus and decoding the object signal, the decoding apparatus further comprising:

a temporary memory connected to the codebook, wherein a content of the codebook is temporarily moved to the temporary memory when a first speaker changes to another, and wherein the content temporarily stored in the temporary memory is read out when the first speaker comes back;

an adjacent vector selection observation device that detects selection of a plurality of adjacent information vectors located adjacent to the vector of the object signal from the codebook within a predetermined time period; and an interpolation vector computation device that interpolates the information vectors based upon selection frequencies of the information vectors and generates an interpolated information vector based upon detection of the plurality of adjacent information vectors, the interpolated information vector being outputted as a decoding result.

2. A system of encoding/decoding with vector quantization including an encoding apparatus and a decoding apparatus each having a codebook for storing information vectors and index that determine the information vectors, the encoding apparatus comparing an object signal to be quantized with each information vector in the codebook, selecting an information vector that is closest to the object signal and outputting an index of the selected information vector, the decoding apparatus referring to the codebook to obtain an information vector corresponding to the index obtained at the encoding apparatus side and decoding the object signal, the encoding apparatus and the decoding apparatus further each comprising:

a temporary memory connected to the codebook, wherein a content of the codebook is temporarily moved to the temporary memory when a first speaker changes to another, and wherein the content temporarily stored in the temporary memory is read out when the first speaker comes back;

an adjacent vector selection observation device that detects selection of a plurality of adjacent information vectors located adjacent to the vector of the object signal from the codebook within a predetermined time period;

an interpolation vector computation device that interpolates the information vectors based upon selection frequencies of the information vectors, and generates a new information vector based upon the detection of the plurality of adjacent information vectors; and a codebook rewriting device that rewrites one of the information vectors in the codebook with the new information vector generated by the interpolation vector computation device.

3. A system of encoding/decoding with vector quantization in accordance with claim 2, further comprising a rewriting vector determination device that weights the information vectors in the codebook and determines an information vector to be rewritten with the new information vector based upon the weighting.

4. An encoding/decoding system with vector quantization having an encoding apparatus and a decoding apparatus each having a codebook for storing various code vectors and index that determine the respective code vectors, the encoding apparatus using the codebook to compare a vector of an object signal to be quantized with each code vector in the codebook, selecting a code vector that matches most closely the vector of the object signal and outputting an index of the selected code vector, the decoding apparatus obtaining a code vector corresponding to the index obtained at the encoding apparatus side by referring to the codebook and decoding the quantized vector, further the encoding apparatus and the decoding apparatus each having a codebook rewriting device for renewing the content of the codebook based upon a result of matching between the vector to be quantized and the code vector, the system comprising:

a temporary memory connected to the codebook, wherein a content of the codebook is temporarily moved to the temporary memory when a first speaker changes to another, and wherein the content temporarily stored in the temporary memory is read out when the first speaker comes back;

an initialization codebook that stores initial contents of the codebook provided at either of the encoding apparatus and the decoding apparatus;

a characteristic extraction device provided at the encoding apparatus that extracts characteristic parameters of the object signal to be encoded; and a characteristic change detection device provided at the encoding apparatus that detects at least a change in the characteristic parameters extracted by the characteristic extraction device, wherein the codebook rewriting device initializes the contents of the codebook with the contents of the initialization codebook when the characteristic change detection device detects the changes in the characteristic parameters.

5. A system of encoding/decoding with vector quantization according to claim 4, further comprising:

a temporary memory device that temporarily stores the contents of the codebook and the characteristic parameters prior to initialization of the codebook; and wherein the codebook rewriting device compares between the characteristic parameters extracted by the characteristic change detection device and the characteristic parameters stored in the temporary memory device when the characteristic change detection device detects a change in the characteristic parameters, rewrites the contents of the codebook with the contents of the codebook stored in the temporary memory device if these parameters approximate each other, and moves the contents of the codebook to the temporary memory device and initializes the codebook with the contents of the initialization codebook if these characteristic parameters do not approximate each other.

6. A system of encoding/decoding with vector quantization according to claim 5, wherein the encoding apparatus supplies initialization information indicating that the contents of the codebook are rewritten with the contents of the initialization codebook, and the decoding apparatus initializes the contents of the codebook with the contents of the initialization codebook based upon the supplied initialization information.

7. A system of encoding/decoding with vector quantization according to claim 5, wherein:

the encoding apparatus includes a decoder that decodes an encoded result to be outputted, an extractor that performs extraction of characteristic parameters with respect to the decoded result by using the characteristic extraction device and an initializing device that initializes the contents of the codebook with the contents of the initialization codebook when a change in the extracted characteristic parameters is detected; and the decoding apparatus includes a decoder that decodes the inputted encoded result, an extractor that performs extraction of the characteristic parameters with respect to the decoded result by using the characteristic extraction device, and an initializing device that initializes the contents of the codebook with the contents of the initialization codebook when a change in the extracted characteristic parameters is detected.

8. A system of encoding/decoding with vector quantization according to claim 5, wherein the object signal to be encoded is a speech signal, and the characteristic change detection device controls the codebook rewriting device based upon changes in at least one of voiced-tone/silence-tone of the speech signal, pitch, characteristic coefficient, spectrum envelope information and gain provided by the characteristic extraction device, as well as changes in voiced-tone/silence-tone of the speech signal, pitch, characteristic coefficient, gain and vector quantization error provided in coding process performed by the encoding apparatus.

9. A system of encoding/decoding with vector quantization according to claim 4, wherein the encoding apparatus supplies initialization information indicating that the contents of the codebook are rewritten with the contents of the initialization codebook, and the decoding apparatus initializes the contents of the codebook with the contents of the initialization codebook based upon the supplied initialization information.

10. A system of encoding/decoding with vector quantization according to claim 4, wherein:

the encoding apparatus includes a decoder that decodes an encoded result to be outputted, an extractor that performs extraction of characteristic parameters with respect to the decoded result by using the characteristic extraction device and an initializing device that initializes the contents of the codebook with the contents of the initialization codebook when a change in the extracted characteristic parameters is detected; and the decoding apparatus includes a decoder that decodes the inputted encoded result, an extractor that performs extraction of the characteristic parameters with respect to the decoded result by using the characteristic extraction device, and an initializing device that initializes the contents of the codebook with the contents of the initialization codebook when a change in the extracted characteristic parameters is detected.

11. A system of encoding/decoding with vector quantization according to claim 4, wherein the object signal to be encoded is a speech signal, and the characteristic change detection device controls the codebook rewriting device based upon changes in at least one of voiced-tone/silence-tone of the speech signal, pitch, characteristic coefficient, spectrum envelope information and gain provided by the characteristic extraction device, as well as changes in voiced-tone/silence-tone of the speech signal, pitch, characteristic coefficient, gain and vector quantization error provided in coding process performed by the encoding apparatus.

12. An encoding apparatus with vector quantization, the apparatus comprising:

a codebook that stores a comparison table between a plurality of code vectors and index that determine the respective code vectors;

a vector quantizer that selects a code vector in the codebook that matches most closely a vector to be quantized for an object signal to be encoded and outputs an index corresponding to the code vector;

a codebook rewriting device that adaptively renews the contents of the codebook based upon a result of matching between the vector to be quantized and the code vector;

an initialization codebook that stores the contents in an initial state; a characteristic extraction device that extracts characteristic parameters of the object signal to be encoded, wherein the codebook rewriting device initializes the contents of the codebook with the contents of the initialization codebook when the characteristic change detection device detects a change in the characteristic parameters; and a temporary memory connected to the codebook, wherein a content of the codebook is temporarily moved to the temporary memory when a first speaker changes to another, and wherein the content temporarily stored in the temporary memory is read out when the first speaker comes back.

13. A decoding apparatus with vector quantization, the apparatus comprising:

a codebook that stores a comparison table between a plurality of code vectors and index that determine the respective code vectors;

a vector dequantizer that obtains a code vector corresponding to a received index by referring to the codebook;

a codebook rewriting device that renews the contents of the codebook based upon a received renewal information;

an initialization codebook that stores contents in an initial state, wherein the codebook rewriting device initializes the contents of the codebook with the contents of the initialization codebook based upon an initialization flag that indicates occurrence of a change in characteristic parameters of an object signal to be encoded; and a temporary memory connected to the codebook, wherein a content of the codebook is temporarily moved to the temporary memory when a first speaker changes to another, and wherein the content temporarily stored in the temporary memory is read out when the first speaker comes back.

14. A method of encoding/decoding employing vector quantization by an encoding/decoding apparatus, the apparatus including an encoding apparatus and a decoding apparatus each having a codebook for storing a plurality of information vectors and index that determine the information vectors, the encoding apparatus comparing a vector of an object signal to be quantized with each information vector in the codebook, selecting an information vector that is closest to the vector of an object signal and outputting an index of the selected information vector, the decoding apparatus referring to the codebook to obtain an information vector corresponding to the index obtained by the encoding apparatus and decoding the object signal, the method comprising the steps of:

temporarily storing a content of the codebook in a temporary memory when a first speaker changes to another, and reading out the content temporarily stored in the temporary memory when the first speaker comes back;

detecting selection of a plurality of adjacent information vectors located adjacent to the vector of the object signal from the codebook within a predetermined time period; and interpolating the information vectors based upon selection frequencies of the information vectors and generating an interpolated information vector based upon detection of the plurality of adjacent information vectors, the interpolated information vector being outputted as a decoding result.

15. A method of encoding/decoding employing vector quantization by an encoding/decoding system, the system including an encoding apparatus and a decoding apparatus, each having a codebook for storing information vectors and index that determine the information vectors, the encoding apparatus comparing an object signal to be quantized with each information vector in the codebook, selecting an information vector that is closest to the object signal and outputting an index of the selected information vector, the decoding apparatus referring to the codebook to obtain an information vector corresponding to the index obtained at the encoding apparatus side and decoding the object signal, the method comprising the steps of:

temporarily storing a content of the codebook in a temporary memory when a first speaker changes to another, and reading out the content temporarily stored in the temporary memory when the first speaker comes back;

detecting selection of a plurality of adjacent information vectors located adjacent to the vector of the object signal from the codebook within a predetermined time period in both the encoding apparatus and the decoding apparatus;

interpolating the information vectors based upon selection frequencies of the information vectors, and generating a new information vector based upon the detection of the plurality of adjacent information vectors in both sides of the encoding apparatus and the decoding apparatus; and rewriting one of the information vectors in the codebook with the new information vector in both the encoding apparatus and the decoding apparatus.

16. A method of encoding/decoding with vector quantization in accordance with claim 15, further comprising the step of weighting the information vector in the codebook and determining an information vector to be rewritten with the new information vector based upon the weighting.

17. A method of encoding/decoding employing vector quantization by an encoding/decoding system, the system having an encoding apparatus and a decoding apparatus, each having a codebook for storing various code vectors and index that determine the respective code vectors, the encoding apparatus using the codebook to compare a vector of an object signal to be quantized with each code vector in the codebook, selecting a code vector that matches most closely the vector of the object signal and outputting an index of the selected code vector, the decoding apparatus obtaining a code vector corresponding to the index obtained at the encoding apparatus side by referring to the codebook and decoding the quantized vector, further the encoding apparatus and the decoding apparatus each having a codebook rewriting device for renewing the content of the codebook based upon a result of matching between the vector to be quantized and the code vector, the method comprising the steps of:

storing initial contents of the codebook provided at both the encoding apparatus and the decoding apparatus;

extracting, at the encoding apparatus, characteristic parameters of the object signal to be encoded;

detecting, at the encoding apparatus, at least a change in the characteristic parameters;

initializing the contents of the codebook with contents of an initialization codebook upon detecting of the changes in the characteristic parameters; and temporarily storing a content of the codebook in a temporary memory when a first speaker changes to another, and reading out the content temporarily stored in the temporary memory when the first speaker comes back.

18. A method of encoding/decoding with vector quantization according to claim 17, further comprising the steps of:

temporarily storing the contents of the codebook in a buffer memory and the characteristic parameters prior to initialization of the codebook;

comparing between the extracted characteristic parameters and the characteristic parameters stored in the buffer memory upon detection of a change in the characteristic parameters; and rewriting the contents of the codebook with the contents stored in the buffer memory if the extracted parameters and the parameters temporarily stored in the buffer approximate to each other, and moving the contents of the codebook to the buffer memory and initializing the codebook with the contents of the initialization codebook if the extracted parameters and the parameters temporarily stored in the buffer do not approximate each other.

19. A method of encoding/decoding with vector quantization according to claim 18, wherein the encoding apparatus supplies initialization information indicating that the content of the codebook is rewritten with the content of the initialization codebook, and the decoding apparatus initializes the content of the codebook with the content of the initialization codebook based upon the supplied initialization information.

20. A method of encoding/decoding with vector quantization according to claim 18, wherein:

the encoding apparatus decodes an encoded result to be outputted, performs extraction of characteristic parameters with respect to the decoded result by using the characteristic extraction device and initializes the contents of the codebook with the contents of the initialization codebook when a change in the extracted characteristic parameters is detected; and the decoding apparatus decodes the inputted encoded result, performs extraction of the characteristic parameters with respect to the decoded result by using the characteristic extraction device, and initializes the contents of the codebook with the contents of the initialization codebook when a change in the extracted characteristic parameters is detected.

21. A method of encoding/decoding with vector quantization according to claim 18, wherein the object signal to be encoded is a speech signal, the method further including the step of controlling rewriting of the codebook based upon a change in at least one of voiced-tone/silence-tone of the speech signal, pitch, characteristic coefficient, spectrum envelope information and gain, as well as changes in voiced-tone/silence-tone of the speech signal, pitch, characteristic coefficient, gain and vector quantization error provided in coding process performed by the encoding apparatus.

22. A method of encoding/decoding with vector quantization according to claim 17, wherein the encoding apparatus supplies initialization information indicating that the content of the codebook is rewritten with the content of the initialization codebook, and the decoding apparatus initializes the content of the codebook with the content of the initialization codebook based upon the supplied initialization information.

23. A method of encoding/decoding with vector quantization according to claim 17, wherein:

the encoding apparatus decodes an encoded result to be outputted, performs extraction of characteristic parameters with respect to the decoded result by using the characteristic extraction device and initializes the contents of the codebook with the contents of the initialization codebook when a change in the extracted characteristic parameters is detected; and the decoding apparatus decodes the inputted encoded result, performs extraction of the characteristic parameters with respect to the decoded result by using the characteristic extraction device, and initializes the contents of the codebook with the contents of the initialization codebook when a change in the extracted characteristic parameters is detected.

24. A method of encoding/decoding with vector quantization according to claim 17, wherein the object signal to be encoded is a speech signal, the method further including the step of controlling rewriting of the codebook based upon a change in at least one of voiced-tone/silence-tone of the speech signal, pitch, characteristic coefficient, spectrum envelope information and gain, as well as changes in voiced-tone/silence-tone of the speech signal, pitch, characteristic coefficient, gain and vector quantization error provided in coding process performed by the encoding apparatus.

25. A method of encoding employing vector quantization, the method comprising the steps of:

storing a comparison table between a plurality of code vectors and index that determine the respective code vectors in a codebook;

selecting a code vector in the codebook that matches most closely a vector to be quantized for an object signal to be encoded and outputting an index corresponding to the code vector;

adaptively renewing contents of the codebook based upon a result of matching between the vector to be quantized and the code vector;

storing contents in an initial state in an initialization codebook;

extracting characteristic parameters of the object signal to be encoded, wherein the contents of the codebook is rewritten with the contents of the initialization codebook upon detection of a change in the characteristic parameters; and temporarily storing a content of the codebook in a temporary memory when a first speaker changes to another, and reading out the content temporarily stored in the temporary memory when the first speaker comes back.

26. A method of decoding employing vector quantization, the method comprising the steps of:

storing a comparison table between a plurality of code vectors and index that determine the respective code vectors in a codebook;

obtaining a code vector corresponding to a received index by referring to the codebook;

renewing contents of the codebook based upon a received renewal information;

storing contents in an initial state in an initialization codebook, wherein the codebook is initialized with the contents of the initialization codebook based upon an initialization flag that indicates occurrence of a change in characteristic parameters of an object signal to be encoded; and temporarily storing a content of the codebook in a temporary memory when a first speaker changes to another, and reading out the content temporarily stored in the temporary memory when the first speaker comes back.

* * * * *